United States Patent [19]
Wang et al.

[11] Patent Number: 5,089,787
[45] Date of Patent: Feb. 18, 1992

[54] OPTICALLY-COUPLED HIGH FREQUENCY AMPLIFIER

[75] Inventors: Haila Wang, Founteay Aux Roses, France; Amnon Yariv, San Marino, Calif.

[73] Assignee: California Institute of Technology, Pasadena, Calif.

[21] Appl. No.: 725,398

[22] Filed: Jul. 1, 1991

Related U.S. Application Data

[63] Continuation of Ser. No. 190,671, May 5, 1985, abandoned.

[51] Int. Cl.[5] .......................... H03F 3/16; H01S 3/13; H03H 7/38
[52] U.S. Cl. ..................................... 330/4.9; 372/82; 359/162; 359/238; 359/278
[58] Field of Search ............... 332/7.51; 330/4.3, 4.9, 330/59, 308; 372/28, 44, 38, 82; 455/611, 617-619, 613

[56] References Cited

U.S. PATENT DOCUMENTS

| | | | |
|---|---|---|---|
| 4,180,786 | 12/1979 | Forward et al. | 333/32 |
| 4,243,951 | 1/1981 | Wolkstein et al. | 372/25 |
| 4,264,875 | 4/1981 | Hunsperger et al. | 332/7.51 |
| 4,295,225 | 10/1981 | Pan | 455/601 |
| 4,399,566 | 8/1983 | Roullet et al. | 455/611 |
| 4,455,658 | 6/1984 | Luther | 372/38 |
| 4,464,759 | 8/1984 | Haus et al. | 372/19 |
| 4,561,119 | 12/1985 | Epworth | 332/7.51 |
| 4,663,596 | 5/1987 | Heebs | 330/4.3 |
| 4,736,164 | 4/1988 | Henning | 330/4.3 |
| 4,754,229 | 6/1988 | Kawakami et al. | 455/327 |
| 4,769,853 | 9/1988 | Goodwin et al. | 332/7.51 |

FOREIGN PATENT DOCUMENTS 52536 5/1982 European Pat. Off. .
8801813 3/1988 World Int. Prop. O. .

OTHER PUBLICATIONS

Henjo et al; "GaAs FET . . . Rate Systems", IEEE Trans. on Microwave Theo. & Tech., vol. MTT-29, #7, 6/81; pp. 629-636.
Lau et al; "Ultra-High Speed Semiconductor Lasers", IEEE SQE, vol. QE-21, #2, 2/85, pp. 121-138.
de La Chapelle et al, "Analysis of Low Loss . . . Transmission", SPIE, vol. 716, pp. 120-125, 9/24/86 Conf.
Hsu et al., "Fiber-Optic Links . . . Transmission", SPIE, vol. 716, pp. 69-75, 9/24/86 Conf.
Stephens et al, "A 1.3 μm Microwave . . . Transmitter", Jour. Light Wave Tech., vol. LT-3, #2, 4/85, pp. 308-315.

Primary Examiner—Nelson Moskowitz
Attorney, Agent, or Firm—Benman & Collins

[57] ABSTRACT

An optically-coupled high frequency amplifier is disclosed herein. The amplifier of the present invention includes a laser and a receiver coupled by an optical beam. The amplifier further includes a modulator responsive to an input signal for modulating the optical beam generated by the laser. The receiver produces an output signal in response to the modulated optical beam. A specific embodiment of the present invention further includes impedance matching means for increasing the maximum operating frequency of the laser and the receiver.

14 Claims, 4 Drawing Sheets

OPTICALLY-COUPLED HIGH FREQUENCY AMPLIFIER

ORIGIN OF THE INVENTION

The invention described herein was made in the performance of work under a contract with the Office of Naval Research no. N00014-85-K-0032. Accordingly, the United States Government has rights in this invention.

This is a continuation of application Ser. No. 07/190,671, filed May 5, 1988, now abandoned.

BACKGROUND OF THE INVENTION

1. Field of the Invention

This invention relates to communication systems. More specifically, this invention relates to high frequency amplifiers.

While the present invention is described herein with reference to a particular embodiment for a particular application, it is understood that the invention is not limited thereto. Those having ordinary skill in the art and access to the teachings provided herein will recognize additional embodiments within the scope thereof.

2. Description of the Related Art

Included among conventional microwave amplification systems are microwave tubes and microwave solid state devices. Microwave tubes are currently employed in large-signal amplification systems and as microwave sources. However, high-voltage requirements, comparatively large physical dimensions, and the occasional need for stabilization circuitry have limited the utility of microwave tubes in certain applications. Microwave solid state amplification devices include microwave transistors as well as negative resistance diodes. Transferred electron devices (TEDs), also referred as Gunn effect devices, constitute one class of commonly used negative resistance diodes, and are some of the most widely used.

The Gunn-effect relates to periodic current fluctuations within uniform semiconductors when an applied DC voltage exceeds a certain predetermined threshold value. A DC voltage may be applied to a Gunn-effect diode to induce an oscillating current which can be utilized as a signal source and circulator-coupled networks have been used in conjunction with Gunn-effect diodes to realize amplifier circuits.

Unfortunately, these amplifier networks have been found to be complex and expensive to manufacture. Further, Gunn-effect devices suffer from low efficiency when used as amplifiers at frequencies above 10 to 15 GHz. Thus, microwave field effect transistors (FETs) are gaining in acceptance as the preferred means of small-signal microwave amplification.

Microwave FETs have inherent advantages relative to earlier microwave bipolar transistors. The efficiency and maximum frequency of amplification of microwave FETs exceed those of comparable bipolar devices. In addition, microwave FETs generally exhibit a low noise figure.

Hence, the combination of low noise and high operation frequencies have made microwave FETs one preferred means of amplification in low-noise receivers. Similarly, the low-noise and high efficiency of microwave FETs have been significant factors in the acceptance of FETs as alternatives for negative resistance diodes such as TEDs in low power applications.

Despite the advantages of microwave FETs over microwave tubes and negative resistance diodes, microwave FETs are subject to the same gain-bandwidth constraint applicable to other semiconductor devices. Moreover, the inherent parasitic feedback capacitance present in FETs also limits high-frequency power gain and can contribute to undesired oscillation. Further, as gate widths are reduced in the fabrication of higher frequency FETs, the current handling capability is correspondingly decreased.

These constraints have limited the power gain of microwave and millimeter wave FETs at high frequencies to less than optimum values. For example, a recent state of the art monolithic microwave GaAs FET amplifier described by Kim, Tserng, and Shih in "IEEE Electron Device Letters", vol. EDL-7, No. 2, February 1986 achieved 10 dB gain at 44 Ghz.

As system requirements for amplification of signals in excess of 90 GHz currently exist, there is a need in the art for a high frequency amplifier offering adequate power gain without significant parasitic feedback coupling.

SUMMARY OF THE INVENTION

The need in the art is addressed by the optically-coupled amplifier of the present invention. The amplifier of the present invention includes a laser and a receiver coupled by an optical beam. The amplifier further includes a modulator responsive to an input signal for modulating the optical beam generated by the laser. The receiver produces an output signal in response to the modulated optical beam. A specific embodiment of the present invention further includes impedance matching means for increasing the maximum operating frequency of the laser and the receiver.

DESCRIPTION OF THE INVENTION

Figure 1:
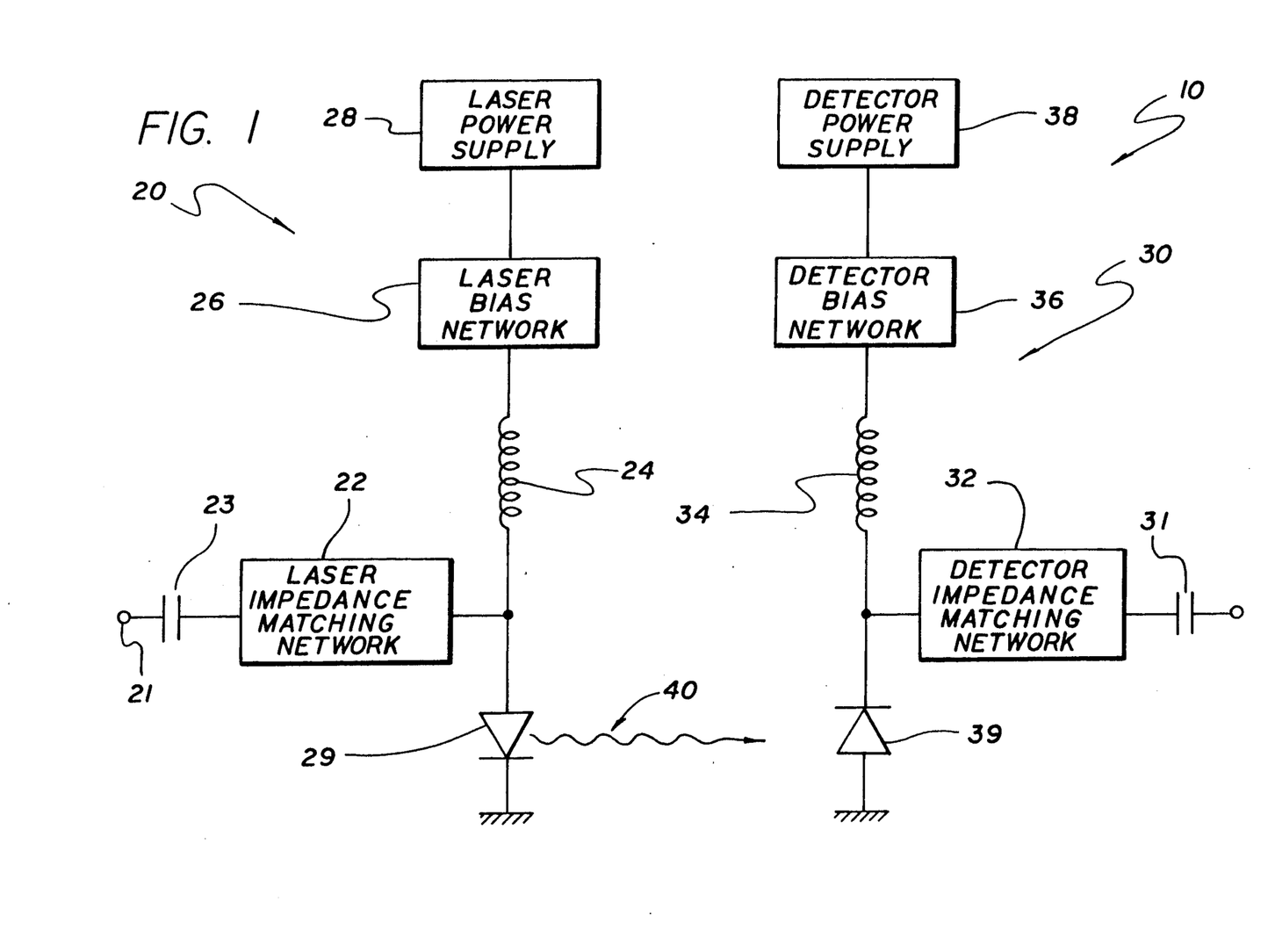
FIG. 1 is a block diagram of a preferred embodiment of the present invention.

As shown in FIG. 1, the amplifier 10 of the present invention includes a source circuit 20 and detector circuit 30. In a preferred embodiment, the source circuit 20 is coupled to the detector circuit 30 by a modulated optical beam 40. The source circuit 20 includes an input terminal 21, a laser impedance matching network 22, a transformer 24 laser bias network 26, laser power supply 28, and diode laser 29. Those skilled in the art will appreciate that generation of the optical beam 40 may be accomplished with sources of electromagnetic energy other than the diode laser 29. The detector circuit 30 includes a detector power supply 38, detector bias network 36, a transformer 34 output line 31, detector impedance matching network 32 and photodiode 39.

As will be described more fully below, a typical high frequency (microwave) input signal impressed on the input terminal 21 is coupled by a capacitive element 23 to the laser impedance matching network 22. The modulated optical beam 40 is generated by the laser 29 in response to the impressed input signal. The photodiode 39 detects the modulated beam 40 and generates an output signal which passes through the detector matching network 32. As the laser 29 and photodiode 39 are coupled solely by the unidirectional beam 40, it is seen from the above that the amplifier 10 provides unilateral amplification of high frequency signals.

Within the source circuit 20, the laser bias network 26 includes circuit elements that convert the voltage available from the laser power supply 28 to a suitable DC bias voltage for the diode laser 29. The bias network 26 allows passage of the DC bias voltage but appears as an open circuit to microwave signals. Thus, microwave signals from the laser impedance matching network 22 or the diode laser 29 are prevented from propagating into the laser power supply 28.

As mentioned above, a microwave signal entering the amplifier 10 at the input terminal 21 is coupled by the capacitive element 23 to the laser impedance matching network 22. At a predetermined frequency the laser impedance matching network 22 appears as a reactance having essentially equal magnitude and opposite phase relative to the capacitive reactance characterizing the diode laser 29. Matching networks are commercially available from ZAX in San Dimas, California provided that equivalent circuit parameters associated with the device to be compensated may be obtained.

The diode laser 29 of the present invention is commercially available from manufacturers such as Ortel in Alhambra, Calif. Laser suppliers typically furnish specifications of laser equivalent circuit parameters necessary for the design of appropriate impedance matching networks. Given the absence of such specifications, those skilled in the art can readily conduct laboratory experiments to determine the necessary circuit parameters.

Figure 2:
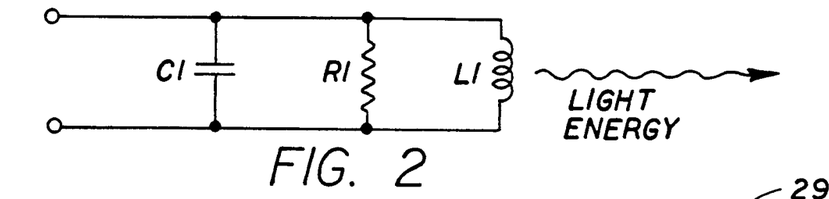
FIG. 2 is an equivalent circuit representation of a diode laser.

FIG. 2 is an equivalent circuit representation of the diode laser 29. The equivalent circuit parameters R1, L1 and C1 model physical characteristics of the represented diode laser as follows:

$$R1 = (kT)/(qI)$$
$$C1 = [qI_{th}/(kT)]*T_s$$
$$L1 = [kT/(qI_{th})][T_p/(T_n-1)]$$

where k = Boltzmann's constant
T = temperature in Kelvin
q = charge of an electron
$I_{th}$ = laser threshold current
I = laser bias current
$T_s$ = electron lifetime
$T_p$ = photon lifetime
$T_n$ = I/Ith A detailed description of the operation of the laser impedance matching network 22 will be provided below.

Referring again to FIG. 1, the detector bias network 36 includes circuit elements that convert the voltage available from the detector power supply 38 to a suitable DC bias voltage for the photodiode 39. As is known in the art, the bias network 36 allows passage of the DC bias voltage but appears as an open circuit to microwave signals. Thus, microwave signals from the photodiode 39 are prevented from propagating into the detector power supply 38.

The photodiode 39 generates an output signal in response to the incident modulated optical beam 40. This output signal is of the same frequency as the microwave signal used to modulate the beam 40 generated by the diode laser 29. At a predetermined frequency the detector impedance matching network 32 appears as a reactance having essentially equal magnitude and opposite phase relative to the capacitive reactance characterizing the photodiode 39. Matching networks suitable for use in conjunction with photodiodes may also be obtained from ZAX in San Dimas, Calif. provided that equivalent circuit parameters associated with the particular photodiode used may be determined.

Figure 4:
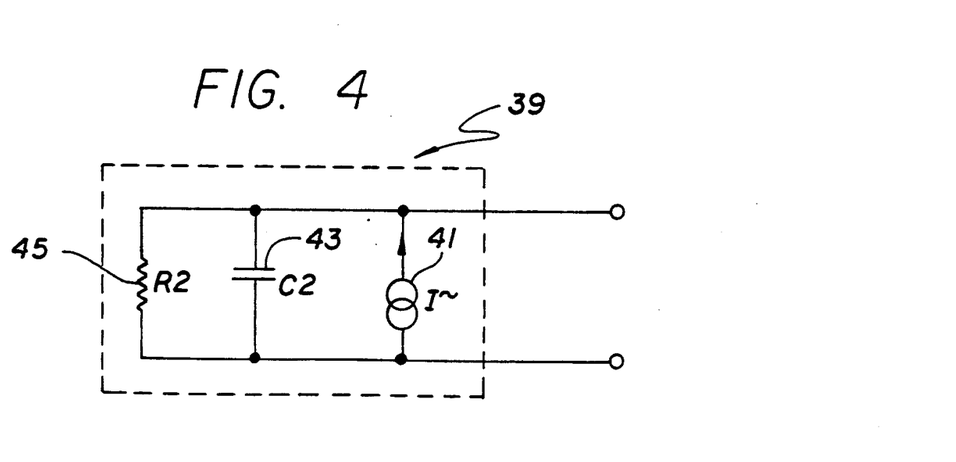
FIG. 4 is an equivalent circuit representation of a photodiode.

FIG. 4 is a three-element equivalent circuit representation of the photodiode 39. The photodiode 39 the present invention is commercially available from manufacturers such as Ortel in Alhambra, Calif. Photodiode suppliers also typically furnish specifications of equivalent circuit parameters necessary for the design of appropriate impedance matching networks. Given the absence of such specifications, those skilled in the art can readily conduct laboratory experiments to determine the necessary circuit parameters.

Referring again to the equivalent circuit in FIG. 2 of the diode laser 29, it will be apparent to one skilled in the art that as the frequency of the applied signal increases, the impedance of C1 decreases and hence a relatively larger percentage of the current is shunted through C1. As the current through the self-inductance L1 is proportional to the modulated optical output power of the diode laser 29, it follows that as the modulation frequency surpasses the relaxation oscillation frequency of the diode laser 29 the optical output power rapidly decreases. This phenomenon has been observed experimentally. For example, Lau et al. "Applied Physics Letters" Vol. 45 (4), Aug. 15, 1984 describes a state-of-the-art gallium aluminum arsenide (GaAlAs) laser that exhibits a decrease of approximately 40 dB/decade in optical output power under direct modulation at frequencies in excess of 11 GHz.

Figure 3A:
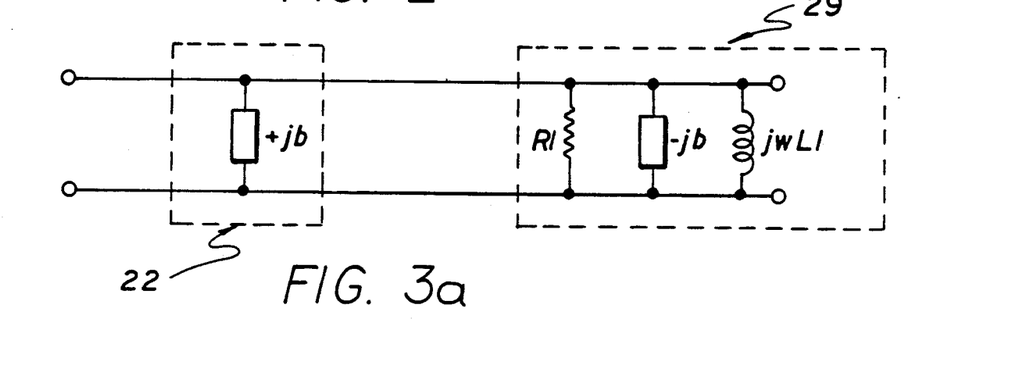
FIG. 3a shows the impedance of the parallel connection of an impedance matching network and diode laser.
Figure 3B:
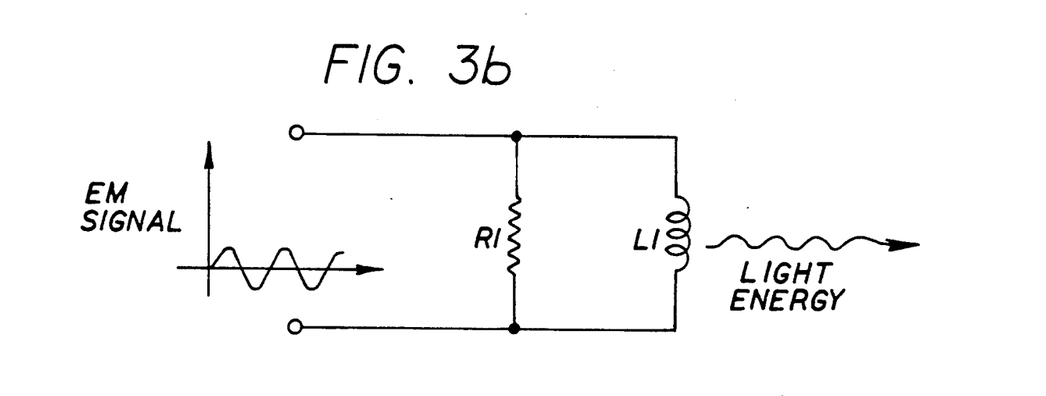
FIG. 3b shows an equivalent circuit of the parallel connection of the impedance matching network and diode laser following cancellation of the conjugate capacitive reactances present in both individual equivalent circuits.

With the aid of FIG. 3, the effect of the laser impedance matching network 22 on the optical output power of the diode laser 29 may now be more readily understood. FIG. 3a shows the capacitive reactances, +jb and −jb, of the laser impedance matching network 22 and diode laser 29, respectively, at the frequency of the modulating signal. With regard to the equivalent circuit parameters of FIG. 2, −jb is equivalent to 1/(jwC1) where "w" is the angular frequency of modulation. As is known in the art, reactances connected in parallel may be summed. This summation results in the equivalent circuit of FIG. 3b which represents the parallel connection of the impedance matching network 22 and the diode laser 29. The absence of any capacitive reactance in the equivalent circuit of FIG. 3b indicates that the impedance matching network 22 will prevent degradation of optical output power of the diode laser 29 when the modulation frequency is above the relaxation oscillation frequency.

Using the results of Morishita, et al. in "Solid-State Electronics", 22, 1979, pp. 951-962 and Lau et al. in "Semiconductors and Semimetals", 22, part B, 1985, pp 69-152 one skilled in the art may perform a calculation which allows expression of the number of photons generated by the diode laser 29 as a function of the number of electrons passing through the self inductance L1. This expression is:

$$P = N_1(2IGT_p)/T_r \quad [1]$$

where
- $N_1$ = quantum efficiency of laser diode
- P = number of photons generated per unit time
- G = optical confinement factor of diode laser
- $T_p$ = photon lifetime
- $T_r$ = photon round trip time
- I = number of electrons passing through L1 per unit time As shown in FIG. 4, a typical photodiode may be modeled as a conventional semiconductor diode in parallel with a current source. The magnitude of the current source is proportional to the optical power incident on the photodiode. The current produced by the photodiode 39 is known to those skilled in the art and is given as:

$$I\sim = N_2[\exp(-iwT)](Pq) \quad [2]$$

where:
- i = square root of $-1$
- q = charge of an electron
- $N_2$ = quantum efficiency of photodiode
- T = transit delay time in the space charge region
- P = number of photons generated per unit time by the diode laser 29 [see equation [1]]
- w = angular modulation frequency
- $I\sim$ = current produced by photodiode 39

The quantum efficiency, "$N_2$", is a figure of merit relating the number of electrons produced by the photodiode to the number of photons incident on the photodiode. Equation [2] assumes that the photodiode 39 is optimally positioned such that essentially all photons emitted by the diode laser 29 may be made to impact the photodiode 39. Equation [2] links the input circuit 20 with the output circuit 30 by relating current produced by the photodiode to the number of photons per unit time produced by the diode laser 29.

Referring to FIG. 4, the current source 41 will produce an AC component of the same frequency as the modulation present on the optical beam 40. The magnitude of the photodiode signal voltage is equal to the quantity of this AC current flowing through the resistance 45 multiplied by the magnitude of the resistance 45. It follows that in order to maximize the signal voltage the current shunted through the capacitance 43 must be minimized. The operation of the detector impedance matching network 32 of FIG. 1 in minimizing the magnitude of the capacitance 43 of the photodiode 39 in FIG. 4 is substantially similar to the operation of the laser impedance matching network 22 in minimizing the capacitance C1 of the diode laser 29 shown in FIG. 2. Hence, the detector impedance matching network 32 may be designed and implemented to compensate for the capacitive reactance 43 in the photodiode 39 using the approach previously described for synthesis of the laser impedance matching network 22.

Given equations [1] and [2] together with the equivalent circuits of the laser 29 and photodiode 39, one skilled in the art may derive the following expression for the power gain of the amplifier 10:

$$U = (\{(N_1N_2G)^2\}\{(1-1/T_n)^2\}R2)/((T_r^2)(w^2)R1) \quad [3]$$

where U is the amplifier power gain. The above equation for power gain was derived under the assumption of negligible reverse power transmission. This follows from observation that the only path other than free space linking the input and output ports is comprised of the optical beam, which propagates energy in the forward direction. Minimizing this feedback can improve bandwidth and stability. The following numerical example uses typical parameters of commercially available lasers and photodiodes and serves to illustrate the capability of an amplifier designed using the teachings of the present invention:

I = 30 mA, Ith = 10 mA, $N_1 = N_2 = 0.5$, G = 0.8,
L = 200 um, R2 = 10 k where L is the length of the laser used. Using the above parameters and setting equation [3] to unity we can solve for the maximum frequency at which amplification occurs. This calculation yields a value of 815 GHz. This frequency is, for example, significantly larger than the cutoff frequency of currently available GaAs FETs. A second calculation using equation [3] and the above parameters shows the amplifier 10 of the present invention exhibiting 18 dB of gain at 94 GHz. As previously mentioned, the recent high performance GaAs FET described by Kim et al. achieved only 10 dB of gain at 44 GHz. It is also noteworthy that the above calculations are based on parameters common to many relatively inexpensive, readily available semiconductor devices. As such, these performance estimates are inherently conservative. Higher quality components would be expected to provide results even more favorable than those cited above.

Figure 5:
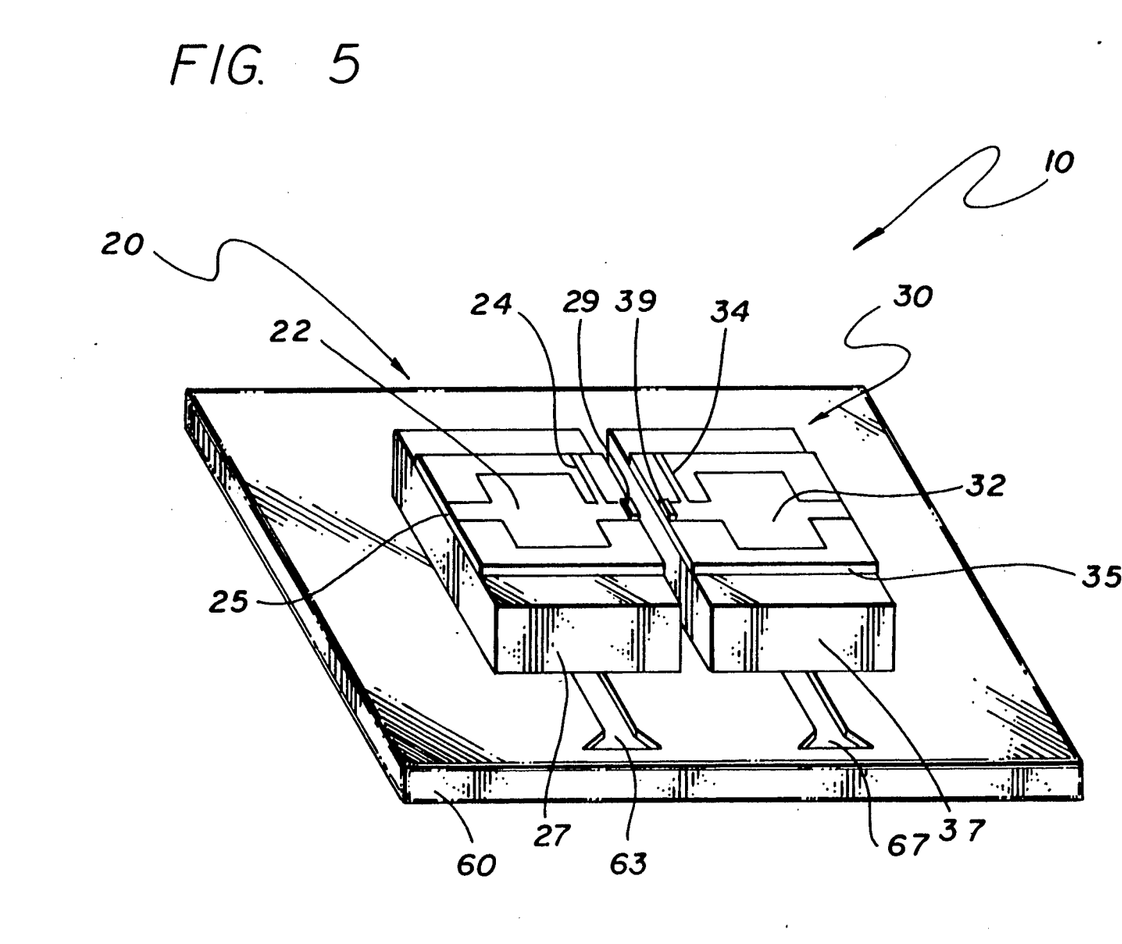
FIG. 5 illustrates a physical realization of a preferred embodiment of the present invention.

A physical realization of the amplifier 10 is shown in FIG. 5. A mount 60 with adjustment slots 63 & 67 supports first and second carriers 27 & 37. The carriers 27 & 37, typically made of copper, support a source circuit 20 and a detector circuit 30, respectively. The adjustment slots 63 & 67 allow the carriers 27 & 37 to be positioned to align the laser 29 and photodiode 39.

The laser impedance matching network 22 comprise microstrip elements etched on an alumina substrate 25. Realization of microstrip elements on the substrate 25 is accomplished as follows. First, a layer of chromium is deposited on the substrate. Though not a good electrical conductor, chromium adheres well to alumina. Second, a layer of copper and then a layer of gold are deposited on the chromium. A mask is used to etch the desired laser impedance matching network 22 and part of the bias network 26 on the deposited metallic layers. The bottom of the substrate 25 is exposed to the same deposition process to provide a ground plane for the microstrip elements etched on the surface of the substrate 25.

The laser 29 is bonded to the carrier 27 and electrically connected by microstrip line to the laser impedance matching network 22 and the laser bias network 26. If an input microwave signal is to be received from a coaxial cable or a waveguide, a transition (not shown) may be mounted on an edge of the substrate 25 and coupled by microstrip line to the laser impedance matching network 22. The detector impedance matching network 32 comprises microstrip elements etched on an alumina substrate 35. Realization of microstrip elements on the substrate 35 is accomplished using the identical deposition and etching process described previously with reference to the substrate 25.

The photodiode 39 is bonded to the substrate 35 and electrically connected by microstrip line to the detector impedance matching network 32 and the bias network 36. If a microwave signal is to be coupled by microstrip line from the detector impedance matching network 32 to a coaxial cable or a waveguide, a transition (not shown) may be mounted on an edge of the substrate 35. The process of fabrication of the microstrip elements included in the detector impedance matching network 32 is identical to the process described earlier for realization of the laser impedance matching network 22.

Figure 6:
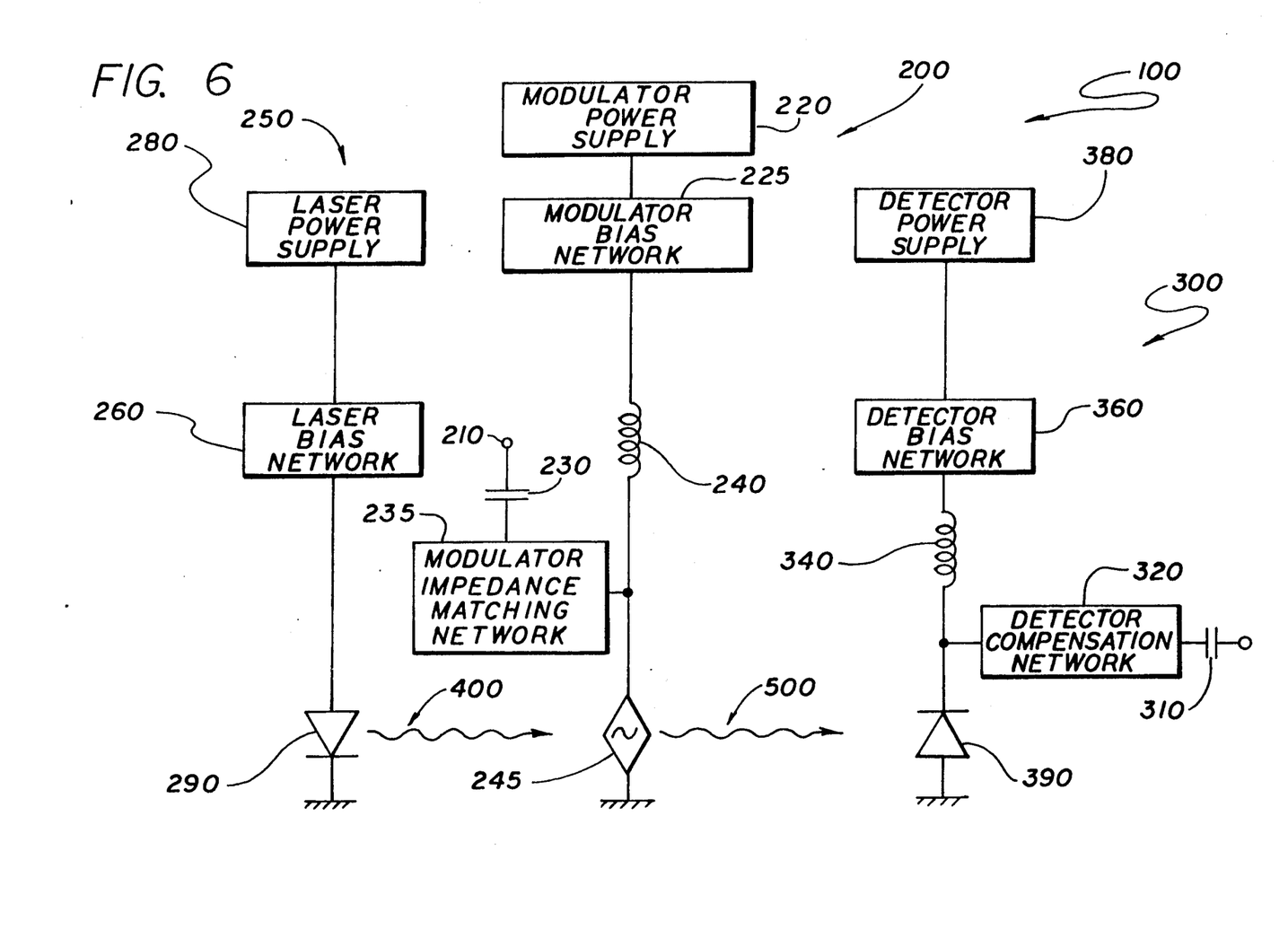
FIG. 6 is a block diagram of an alternative embodiment of the present invention.

As shown in FIG. 1, the amplifier 10 of a preferred embodiment of the present invention provides the modulated beam 40 through direct modulation of the voltage across the diode laser 29 by a microwave signal impressed on the input terminal 21. As shown in FIG. 6, an amplifier 100 comprising an alternate embodiment of the present invention generates a modulated beam 500 in a manner different from that described above.

Referring to FIG. 6, the amplifier 100 includes a modulator circuit 200, a source circuit 250, and a detector circuit 300. The source circuit 250 includes a laser bias network 260, laser power supply 280 and diode laser 290. The modulator circuit 200 includes a modulator power supply 220, modulator bias network 225, a transformer 240 modulator impedance matching network 235, and an electrooptic modulator 245. The detector circuit 300 of the amplifier 100 is identical to the detector circuit 30 of the amplifier 10 in FIG. 1. Included in the detector circuit 300 are a detector power supply 380, detector bias network 360, output line 310, detector impedance matching network 320 and photodiode 390.

A microwave signal entering the amplifier 100 at the input terminal 210 is coupled by a capacitive element 230 to the electro-optic modulator 245. The bias network 225 prevents the microwave signal from entering the modulator power supply 220. The electro-optic modulator 245 is positioned in the path of an optical beam 400 emitted by the laser 290. Those skilled in the art will appreciate that modulation by the electro-optic modulator 245 of the microwave signal impressed on the input terminal 210 will result in modulation of the optical beam 400. The modulated optical beam 500 is subsequently emitted by the electro-optic modulator 245 and propagates to the photodiode 390.

The photodiode 390 generates a microwave output signal in response to the incident modulated optical beam 500. This output signal is of the same frequency as the microwave signal modulating the bias voltage of the electro-optic modulator 245. A transformer 340 transforms the impedance of the photodiode 390 to the characteristic impedance of the output line 310. In this manner the amplifier 100 of the present invention amplifies high frequency signals impressed upon the input terminal 210.

Within the source circuit 250, the laser bias network 260 includes circuit elements that convert the voltage available from the laser power supply 280 to a suitable DC bias voltage for the diode laser 290. With a bias voltage present, the laser diode 290 emits an optical beam 400.

The modulator bias network 225 of the modulator circuit 200 includes circuit elements that convert the voltage available from the modulator power supply 220 to a suitable DC bias voltage for the modulator 245. As is known in the art, the bias network 225 allows passage of the DC bias voltage but appears as an open circuit to microwave signals. Thus, microwave signals emanating from the modulator 245 are prevented from propagating into the modulator power supply 220.

The detector bias network 360 includes circuit elements that convert the voltage available from the detector power supply 380 to a suitable DC bias voltage for the photodiode 390. As is known in the art, the bias network 360 allows passage of the DC bias voltage but appears as an open circuit to microwave signals. Thus, microwave signals from the photodiode 390 are prevented from propagating into the detector power supply 380.

At the modulation frequency the detector impedance matching network 320 appears as a reactance having essentially equal magnitude and opposite phase relative to the capacitive reactance characterizing the photodiode 390. Matching networks suitable for use in conjunction with photodiodes are commercially available provided that equivalent circuit parameters associated with the particular photodiode used may be determined. The photodiode 390 of the present invention is available from manufacturers such as Ortel in Alhambra, Calif. Photodiode suppliers typically furnish specifications of equivalent circuit parameters necessary for the design of appropriate impedance matching networks. Given the absence of such specifications, those skilled in the art can readily conduct laboratory experiments to determine the necessary circuit parameters.

The maximum frequency of operation of the amplifier 100 has no known theoretical limit. In practical terms, extremely high frequency operation will be contingent upon the ability to adequately characterize equivalent circuit parameters associated with the photodiode 390. This characterization is necessary to enable design of the detector impedance matching network 320.

While the present invention has been described herein with reference to a particular embodiment, it is understood that the invention is not limited thereto. For example, the invention is not limited to utilization of a diode laser for generation of an optical beam. Other suitable sources of electromagnetic radiation may be employed without departing from the scope of the invention. Similarly, the invention is not limited to specific electronics for detection of the optical beam. For example a photoresistor, avalanche diode, or photoconductor may be used instead of the photodiode. Further, other embodiments may integrate a laser and photodetector on the same substrate. It is also understood the teachings of this invention may be utilized by one having ordinary skill in the art to make modifications within the scope thereof. Such modifications may include implementation of additional circuitry within embodiments related to those described herein to realize devices such as oscillators or mixers. It is therefore contemplated by the appended claims to cover any and all such modifications.

Accordingly,

What is claimed is:

1. A high-frequency amplifier comprising:
   laser means, including inherent inductive and capacitive characteristics, for generating a beam of electromagnetic energy;
   modulating means for modulating said beam of electromagnetic energy in response to an input signal having a modulation frequency in excess of ninety gigahertz;
   laser impedance matching means, coupled to said laser means, for increasing the maximum operating frequency of said laser means and including first reactive means for compensating for said inherent inductive and capacitive characteristics of said laser means;

receiving means, including inherent inductive and capacitive characteristics and electromagnetically coupled by said beam to said laser means, for receiving said beam and for providing an output signal in response thereto; and receiver impedance matching means, coupled to said receiving means, for increasing the maximum operating frequency of said receiving means and including second reactive means for compensating for said inherent inductive and capacitive characteristics of said receiving means.

2. The amplifier of claim 1 wherein said first reactive means includes circuit elements realizing reactances conjugate to said inductive and capacitive characteristics of said laser means and said second reactive means includes circuit elements realizing reactances conjugate to said inductive and capacitive characteristics of said receiving means.

3. In a high-frequency amplifier including an electromagnetic source having inductive and capactivie characteristics, a method of amplifying an electromagnetic signal comprising the steps of:
   (a) generating an electromagnetic beam with said source;
   (b) modulating said beam in response to said signal at a modulation frequency in excess of ninety gigahertz;
   (c) compensating for said inductive and capacitive characteristics by providing circuit elements which realize inductive and capacitive reactances conjugate to said characteristics; and
   (d) receiving said beam and providing an output signal in response thereto.

4. In a high-frequency amplifier including an electromagnetic source having inductive and capactivie characteristics, a method of amplifying an electromagnetic signal comprising the steps of:
   (a) generating an electromagnetic beam;
   (b) modulating said beam in response to said signal at a modulation frequency in excess of ninety gigahertz;
   (c) receiving said beam with said receiving means and providing an output signal in response thereto; and
   (d) compensating for said inductive and capacitive characteristics by providing circuit elements which realize inductive and capacitive reactances conjugate to said characteristics at the frequency of said output signal.

5. In a high-frequency amplifier, including an electromagnetic energy source having first inductive and capacitive characteristics and further including receiving means with second inductive and capacitive characteristics, a method of amplifying an electromagnetic signal comprising the steps of:
   (a) generating an electromagnetic beam with said electromagnetic energy source;
   (b) focusing said beam;
   (c) modulating said beam in response to said signal at a modulation frequency in excess of ninety gigahertz;
   (d) compensating for said first inductive and capacitive characteristics by providing circuit elements realizing reactances conjugate to said first characteristics;
   (e) receiving said beam with said receiving means and providing an output signal in response thereto; and
   (f) compensating for said second inductive and capacitive characteristics by providing circuit elements realizing reactances conjugate to said second characteristics.

6. A method of increasing the output power of an electromagnetic source biased by a modulated signal having a frequency in excess of ninety gigahertz comprising the steps of:
   (a) modeling inductive and capacitive characteristics of said source;
   (b) compensating for said inductive and capacitive characteristics by designing a network which realizes reactances conjugate to said characteristics;
   (c) fabricating said network; and
   (d) coupling said network to said source.

7. A method of increasing the power of a signal produced by an electromagnetic detector under illumination by a modulated electromagnetic beam having a modulation frequency in excess of ninety gigahertz comprising the steps of:
   (a) modeling inductive and capacitive characteristics of said source;
   (b) compensating for said inductive and capacitive characteristics by designing a network which realizes reactances conjugate to said characteristics;
   (c) fabricating said network; and
   (d) coupling said network to said detector.

8. A high frequency amplifier comprising:
laser means for generating a beam of electromagnetic energy, said laser means having inherent reactive characteristics;

modulating means for modulating said beam of electromagnetic energy in response to an input signal having a modulation frequency in excess of ninety gigahertz, said modulating means including laser impedance matching means for increasing the maximum operating frequency of said laser means, said laser impedance matching means including reactive means for compensating for said inherent reactive characteristics of said laser means; and receiving means, electromagnetically coupled by said beam to said laser means, for receiving said beam and for providing an output signal in response thereto.

9. A high frequency amplifier comprising:
laser means for generating a beam of electromagnetic energy, said laser means having inherent reactive characteristics;

modulating means for modulating said beam of electromagnetic energy in response to an input signal having a modulation frequency in excess of ninety gigahertz; and receiving means, electromagnetically coupled by said beam to said laser means, for receiving said beam and for providing an output signal in response thereto, said receiving means having inherent reactive characteristics and including receiver impedance matching means for increasing the maximum operating frequency of said receiving means, said impedance matching means including reactance means for compensating for said inherent reactive characteristics of said receiving means.

10. The amplifier of claim 9 wherein said modulating means comprises an electro-optic modulator positioned between said laser means and said receiving means.

11. A millimeter wave amplifier comprising:

laser means for generating a beam of electromagnetic energy, said laser means having inherent reactive characteristics;

modulating means for modulating said beam of electromagnetic energy in response to an input millimeter wave signal having a modulation frequency in excess of ninety gigahertz, said modulating means including laser impedance matching means for increasing the maximum operating frequency of said laser means, said laser impedance matching means including reactive means for compensating for said inherent reactive characteristics of said laser means; and receiving means, electromagnetically coupled by said beam to said laser means, for receiving sadi beam and for providing an output millimeter wave signal with gain in response thereo.

12. A millimeter wave amplifier comprising:

laser means for generating a beam of electromagnetic energy, said laser means having inherent reactive characteristics;

modulating means for modulating said beam of electromagnetic energy in response to an input millimeter wave signal having a modulation frequency in excess of ninety gigahertz; and receiving means, electromagnetically coupled by said beam to said laser means, for receiving said beam and for providing an output millimeter wave signal with gain in response thereto, said receiving means having inheent reactive characteristics and including receiver impedance matching means for increasing the maximum operating frequency of said receiving means, said receiver impedance matching means including reactance means for compensating for said inherent reactive characteristics of said receiving means.

13. A millimeter wave amplifier comprising:

laser means for generating a beam of electromagnetic energy, said laser means having inherent reactive characteristics;

laser impedance matching means for increasing the maximum operating frequency of said laser means, said laser impedance matching means including first reactive means for compensating for said inherent reactive characteristics of said laser means;

modulating means for modulating said beam of electromagnetic energy in response to an input millimeter wave signal having a modulation frequency in excess of ninety gigahertz;

receiving means, electromagnetically coupled by said beam to said laser means, for receiving said beam and for providing an output millimeter wave signal with gain in response thereto, said receiving means having inherent reactive characteristics; and receiving impedance matching means coupled to said receiving means for increasing the maximum operating frequency of said receivign means, said receiver impedance matching means including reactive means for compensating for said inherent reactive characteristics of said receiving means.

14. The amplifier of claim 8 wherein said modulating means cmoprises an electro-optic modulator positioned between said laser means and said receiving means.

* * * * *